(12) United States Patent
Dent et al.

(10) Patent No.: US 6,201,452 B1
(45) Date of Patent: Mar. 13, 2001

(54) SYSTEMS AND METHODS FOR CONVERTING A STREAM OF COMPLEX NUMBERS INTO A MODULATED RADIO POWER SIGNAL

(75) Inventors: Paul W. Dent, Pittsboro; Alan R. Holden, Apex; William O. Camp, Jr., Chapel Hill, all of NC (US)

(73) Assignee: Ericsson Inc., Research Triangle Park, NC (US)

( * ) Notice: Subject to any disclaimer, the term of this patent is extended or adjusted under 35 U.S.C. 154(b) by 0 days.

(21) Appl. No.: 09/208,912

(22) Filed: Dec. 10, 1998

(51) Int. Cl.[7] .................................................. H03C 1/00
(52) U.S. Cl. ........................ 332/103; 332/145; 330/10; 330/124 R; 375/298; 375/300; 363/43
(58) Field of Search ..................... 332/103, 145; 330/252, 124 R, 10; 363/43; 307/82; 375/298, 300

(56) References Cited

U.S. PATENT DOCUMENTS

| | | |
|---|---|---|
| 2,210,028 | 8/1940 | Doherty . |
| 3,448,366 | 6/1969 | Goff ........................................ 363/43 |
| 3,777,275 | 12/1973 | Cox ......................................... 330/10 |
| 3,805,139 | 4/1974 | Hoffman, Jr. et al. ................ 307/64 |
| 3,906,401 | 9/1975 | Seidel ..................................... 332/151 |
| 3,909,742 | 9/1975 | Cox et al. ............................... 330/84 |
| 3,927,379 | 12/1975 | Cox et al. ............................... 330/10 |
| 4,090,147 | 5/1978 | Seidel ..................................... 330/10 |
| 4,178,557 | 12/1979 | Henry ..................................... 330/10 |
| 4,315,107 | 2/1982 | Ciesielka et al. ..................... 379/400 |
| 4,420,723 | 12/1983 | de Jager ................................. 330/10 |
| 4,433,312 | 2/1984 | Kahn . |
| 4,485,357 | 11/1984 | Voorman ............................... 332/145 |
| 4,509,017 | 4/1985 | Andren et al. ........................ 329/308 |

(List continued on next page.)

FOREIGN PATENT DOCUMENTS

| | | |
|---|---|---|
| 0 471 346 A1 | 2/1992 | (EP) . |
| 0 598 585 A2 | 5/1994 | (EP) . |
| 0 708 546 A2 | 4/1996 | (EP) . |
| 0 725 478 A1 | 8/1996 | (EP) . |
| 2 267 402 | 12/1993 | (GB) . |
| WO 97/48219 | 12/1997 | (WO) . |
| WO 99/55206 | 10/1999 | (WO) . |

OTHER PUBLICATIONS

Chireix, "High Power Outphasing Modulation," Proceedings of the Institute of Radio Engineers, vol. 23, No. 11, Nov. 1935, pp. 1370–1392.

(List continued on next page.)

*Primary Examiner*—Arnold Kinkead
(74) *Attorney, Agent, or Firm*—Myers Bigel Sibley & Sajovec

(57) ABSTRACT

Modulation systems and methods can modulate a stream of complex numbers representing a desired modulation of a radio signal by representing a real part of each of the complex numbers in a stream of complex numbers representing a desired modulation of a radio signal, as a plurality of first digits of decreasing numerical significance and representing an imaginary part of each of the complex numbers as a plurality of second digits of decreasing numerical significance. A respective one of the first digits and a respective one of the second digits of like numerical significance are grouped to form a plurality of phase control symbols. A respective phase control symbol is then used to control the phase of an output signal at the radio carrier frequency from a respective one of the plurality of power amplifiers. Each of the power amplifiers provides an output power level that is related to the numerical significance of the first and second digits that form the associated phase control symbol. The output power levels of the plurality of power amplifiers are combined to thereby form the modulated radio power signal.

46 Claims, 7 Drawing Sheets

U.S. PATENT DOCUMENTS

| | | | |
|---|---|---|---|
| 4,580,111 | 4/1986 | Swanson . | |
| 4,791,815 | 12/1988 | Yamaguchi et al. | 73/504.16 |
| 4,862,116 | 8/1989 | Olver | 332/145 |
| 5,077,539 | 12/1991 | Howatt | 330/10 |
| 5,086,450 | 2/1992 | Kitagawa et al. | 379/40 |
| 5,365,187 | 11/1994 | Hornak et al. | 330/10 |
| 5,410,280 | 4/1995 | Linguet et al. | 332/149 |
| 5,420,541 | 5/1995 | Upton et al. | 330/286 |
| 5,438,301 | 8/1995 | Havens et al. | 331/45 |
| 5,453,717 | 9/1995 | Gerfault | 330/146 |
| 5,483,433 | 1/1996 | Yang | 363/43 |
| 5,483,681 | 1/1996 | Bergsten et al. | 455/126 |
| 5,559,468 | 9/1996 | Gailus et al. | 330/110 |
| 5,568,088 | 10/1996 | Dent et al. | 330/151 |
| 5,574,967 | 11/1996 | Dent et al. | 455/12.1 |
| 5,612,651 * | 3/1997 | Chethik | 332/103 |
| 5,631,604 | 5/1997 | Dent et al. | 330/124 R |
| 5,638,024 | 6/1997 | Dent et al. | 330/84 |
| 5,682,303 | 10/1997 | Goad | 363/71 |
| 5,694,093 | 12/1997 | DaSilva et al. | 332/103 |
| 5,732,333 | 3/1998 | Cox et al. | 455/126 |
| 5,734,565 | 3/1998 | Mueller et al. | 363/132 |
| 5,767,750 | 6/1998 | Yamaji | 332/103 |
| 5,778,028 | 7/1998 | Kaufmann | 375/296 |
| 5,815,531 | 9/1998 | Dent | 375/298 |
| 5,900,778 | 5/1999 | Stonick et al. | 330/149 |
| 5,930,128 | 7/1999 | Dent | 363/43 |
| 5,990,734 | 11/1999 | Wright et al. | 330/124 R |

OTHER PUBLICATIONS

U. S. Pat. application 09/054,063 filed Apr. 2, 1998.

U. S. Pat. application 09/054,060 filed Apr. 2, 1998.

International Search Report, PCT/US99/24332, Feb. 24, 2000.

Morais et al., NLA–QAM: A Method for Generating High–Power QAM Signals Through Nonlinear Amplification, IEEE Transactions on Communications, vol. Com–30, No. 3, Mar. 1982, pp. 517–522.

International Search Report, PCT/US99/27008, Feb. 24, 2000.

International Search Report, PCT/US99/05681, Jul. 6, 1999.

International Search Report, PCT/US99/26913, Jul. 24, 2000.

* cited by examiner-

US 6,201,452 B1

SYSTEMS AND METHODS FOR CONVERTING A STREAM OF COMPLEX NUMBERS INTO A MODULATED RADIO POWER SIGNAL

FIELD OF THE INVENTION

This invention relates to modulation systems and methods and more particularly to systems and methods that can efficiently modulate a signal onto a radio frequency carrier.

BACKGROUND OF THE INVENTION

Modulation systems and methods are widely used in transmitters to modulate information including voice and/or data onto a carrier. The carrier may be a final carrier or an intermediate carrier. The carrier frequency can be in UHF, VHF, RF, microwave or any other frequency band. Modulators are also referred to as "mixers" or "multipliers". For example, in a mobile radiotelephone, a modulator is used in the radiotelephone transmitter.

In modern radiotelephone communications, mobile radiotelephones continue to decrease in size, cost and power consumption. In order to satisfy these objectives, it is generally desirable to provide modulation systems and methods that can provide high power modulation while reducing the amount of battery power that is consumed. Unfortunately, the power amplifier of a modulator may consume excessive power due to efficiency limitations therein. More specifically, it is known to provide linear Class-A or Class-AB power amplifiers that may have efficiencies as low as 30% or less. Thus, large amounts of battery power may be wasted as heat.

In modulation systems and methods, it is known to provide a desired modulation of a radio signal as a stream of complex numbers including a real part and an imaginary part. Such a stream of complex numbers may be generated by a digital signal processor in a radiotelephone. Systems and methods for modulating a stream of complex numbers are described in U.S. Pat. No. 5,815,531 to the present co-inventor Dent entitled "Transmitter for Encoded Data Bits", assigned to the assignee of the present invention, the disclosure of which is hereby incorporated herein by reference.

As described in the '531 patent, Quadrature Amplitude Modulated signals are generated from data bits by using a first Quadrature Phase Shift Keying (QPSK) modulator for encoding a first pair of the data bits into one of four carrier signal phases, thereby producing a first QPSK signal. A second QPSK modulator encodes a second pair of the data bits into one of four carrier signal phases, thereby producing a second QPSK signal. The first QPSK signal is amplified to a first power level, and the second QPSK signal is amplified to a second power level. The first and second amplified signals are then combined to produce a signal in which four data bits are encoded. Offset Quadrature Phase Shift Keying (OQPSK) may be used in place of the first and second QPSK modulators, so that an Offset Quadrature Amplitude Modulation (OQAM) transmitter is formed. An OQPSK modulator encodes data bits by encoding a first sub-group of the data bits into a real part of a complex signal at an odd instant of a clock, and by encoding a second sub-group of the data bits into an imaginary part of the complex signal at an even instant of the clock. OQPSK modulation provides the benefit of having all signal transitions being constrained to trajectories around constant radius circles, thereby producing spectral efficiency. See the '531 patent abstract.

Notwithstanding the improvements of the above described patent, there continues to be a need for improved methods and systems for converting a stream of complex numbers representing a desired modulation of a radio signal into a modulated radio power signal at a radio carrier frequency. Preferably, these systems and methods can perform conversion at high efficiencies so that the size, cost and/or power consumption of the modulation system may be reduced.

SUMMARY OF THE INVENTION

It is therefore an object of the present invention to provide improved modulation systems and methods.

It is another object of the present invention to provide modulation systems and methods that can provide high efficiency.

It is yet another object of the present invention to provide modulation systems and methods that can modulate a stream of complex numbers representing a desired modulation of a radio signal, at high efficiency.

These and other objects are provided, according to the present invention, by representing a real part of each of the complex numbers in a stream of complex numbers representing a desired modulation of a radio signal, as a plurality of first digits of decreasing numerical significance and representing an imaginary part of each of the complex numbers as a plurality of second digits of decreasing numerical significance. A respective one of the first digits and a respective one of the second digits of like numerical significance are grouped to form a plurality of phase control symbols. A respective phase control symbol is then used to control the phase of an output signal at the radio carrier frequency from a respective one of the plurality of power amplifiers. Each of the power amplifiers provides an output power level that is related to the numerical significance of the first and second digits that form the associated phase control symbol. The output power levels of the plurality of power amplifiers are combined to thereby form the modulated radio power signal.

Preferably, the digits are binary digits such that each of the phase control symbols is one of four values. The power amplifiers are preferably saturated power amplifiers that produce a constant radio frequency voltage output. More preferably, the power amplifiers are bilateral power amplifiers that allow current to flow from and to an amplifier power supply.

The output levels of the plurality of power amplifiers may be combined using various techniques. For example, a respective output power level may be applied to a primary winding of a respective one of a plurality of transformers, the secondary windings of which are serially coupled to produce the modulated radio power signal. Alternatively, a respective output power level may be applied to a respective quarter wave transmission line, and the quarter wave transmission lines may be coupled to one another to produce the modulated radio power signal. In yet another alternative, at least two of the phase control signals of the least numerical significance may be coupled to at least one linear amplifier to produce a linear output. The linear output and the output power levels of the plurality of power amplifiers may then be combined to form the modulated radio power signal.

According to another aspect of the present invention, a real part of each of the complex numbers is represented as a plurality of first digits of decreasing numerical significance and an imaginary part of each of the complex numbers is represented as a plurality of second digits of decreasing numerical significance. A plurality of phase modulators is provided, a respective one of which is responsive to a respective one of the plurality of first digits and a respective one of the plurality of second digits of like numerical significance, and to the radio carrier frequency, to produce a phase modulated output at the radio carrier frequency. A plurality of power amplifiers is provided, a respective one of which amplifies a respective one of the phase modulated outputs of the phase modulators to an amplifier power level at an output thereof. A combining circuit combines the outputs of the power amplifiers according to a combining ratio to produce the modulated radio power signal. Either the amplifier output level or the combining ratio or both are selected such that the modulated radio power signal is related to the numerical significance of the plurality of first and second digits.

In a first embodiment, each of the power amplifiers produces the same amplifier output level and the combining ratio is selected such that the outputs of the power amplifiers are combined according to a ratio that is related to the numerical significance of the digits that are associated with the respective power amplifier. In another alternative, the combining ratio is unity and the amplifier output level of a respective power amplifier is related to the numerical significance of the digits that are associated therewith. In yet another alternative, both the amplifier output level and combining ratio are selected such that the modulated radio power signal is related to the numerical significance of the plurality of first and second digits.

The combining circuit may comprise a plurality of transformers, each having a primary winding and a secondary winding. A respective primary winding is coupled to a respective power amplifier. The plurality of secondary windings are serially coupled to produce the modulated radio power signal. Alternatively, the combining circuit may comprise a plurality of quarter wave length transmission lines, a respective one of which is coupled between a respective power amplifier and an output node to produce the modulated radio power signal at the output node.

The digits preferably are binary digits such that each of the phase modulated outputs has one of four values. The power amplifiers are preferably saturated power amplifiers that produce a constant radio frequency voltage output at the amplifier power level. More preferably, the power amplifiers are bilateral power amplifiers that allow current flow from and to an amplifier power supply.

At least one linear amplifier may be provided that is associated with at least two of the first and second digits of least numerical significance, to generate a linear output voltage at an output thereof that is proportional to combined values of the at least two of the first and second digits of least numerical significance. The combiner combines the output of the at least one linear amplifier and the outputs of the power amplifiers.

Accordingly, the present invention can convert the stream of complex numbers representing a desired modulation of a radio signal into a modulated radio power signal at a radio carrier frequency at high efficiency. Reduced size, cost and/or power consumption of a mobile radiotelephone or other transmitter may be obtained. Power modulation systems and methods may be provided.

DETAILED DESCRIPTION OF PREFERRED EMBODIMENTS

Figure 1:
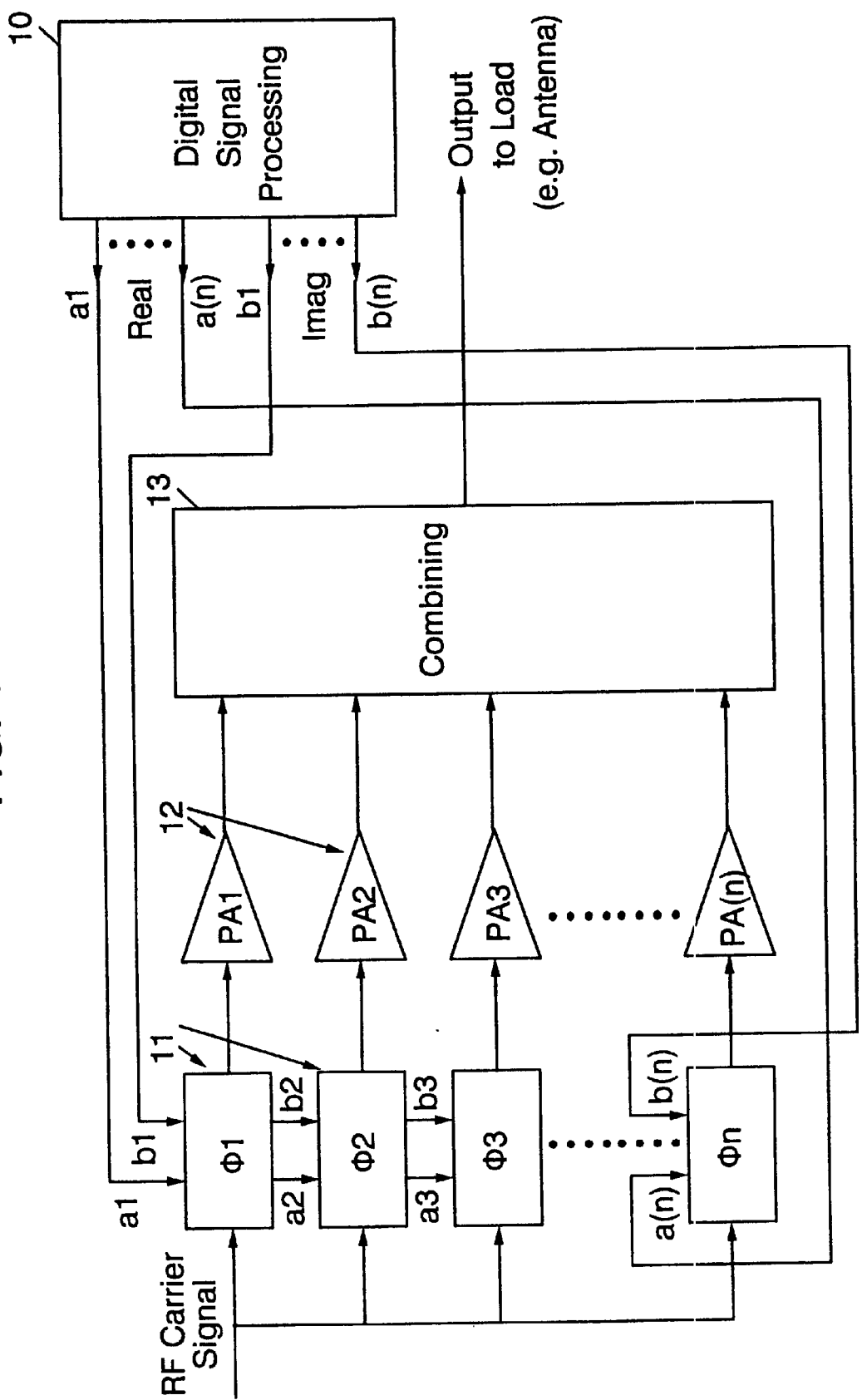
FIG. 1 is a block diagram illustrating systems and methods for converting a stream of complex numbers into a modulated radio power signal at a radio carrier frequency according to the present invention.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout. It will be understood that when an element is referred to as being "coupled" to another element, it can be directly coupled to the other element or intervening elements may also be present.

As will be appreciated by one of skill in the art, the present invention may be embodied as systems (apparatus) or methods. The present invention may take the form of an entirely hardware embodiment or an embodiment combining software and hardware aspects. Accordingly, individual blocks and combinations of block in the drawings support combinations of means for performing the specified functions and combinations of steps for performing the specified functions. Each of the blocks of the drawings, and combinations of blocks of the drawings, may be embodied in many different ways, as is well known to those of skill in the art.

According to the present invention, a plurality of radio frequency power amplifiers that operate efficiently at successively diminishing saturated power levels, have their outputs combined such that substantially the same current waveform flows in the output power amplifier devices of all amplifiers. The combined signal is output to a load, such as an antenna, preferably via suitable harmonic suppression filtering.

The drive signal to each amplifier is provided by the output of an associated phase modulator. Each phase modulator selects one of four output phase values, preferably spaced at 90° intervals around the full 360° circle. Phase filtering can provide smooth transition between successive phase values.

Selection of one of the four phases is determined, for each phase modulator, by a pair of bits, one bit determining the sign of the cosine of the phase value and the other bit determining the sign of the sine of the phase value. The cosine sign-determining bits for all phase modulators form a binary word numerically representative of the real part of a desired transmitted complex vector while the sine sign-determining bits form the imaginary part.

A processor such as a digital signal processor computes successive complex vectors at a given sampling rate, the succession of vectors defining a complex modulation waveform representative of an information signal to be modulated. Each complex vector includes a real numerical part and an imaginary numerical part having a plurality of bits at least equal to the plurality of phase modulators. The real and imaginary parts are applied to the plurality of phase modulators by connecting one real bit and one imaginary bit to each modulator. A common RF carrier signal is also supplied to each modulator. Thus, the combined power amplifiers produce a modulated RF power signal into the load bearing the desired informational modulation, with high conversion efficiency from the DC power source to RF power into the load.

To facilitate smoothing phase transitions in the phase modulators, each successive new complex vector's real part may be applied to the modulators at alternate instants of a sampling clock while new imaginary parts are applied at the intervening instants. Thus, each phase value may only change by $+90°$ or $-90°$ between instants of the sampling clock. Phase transitions may then be smoothed, for each modulator, with the aid of a phase locked loop.

In one embodiment, the amplifiers are combined with the aid of isolating transformers that allow the amplifier output signals to be effectively connected in series with the load. In a second embodiment, the amplifiers are combined by quarter wavelength transmission lines.

Referring now to FIG. 1, a processor such as a digital signal processor 10 supplies a sequence of complex numerical values $A+jB$ where A is defined by the "n" digits $a1, a2 \ldots a(n)$ and B is defined by the "n" digits $b1, b2 \ldots b(n)$. One digit each of A and B of like significance, such as the most significant digits $a1$ and $b1$, is fed to a respective one of phase modulators 11, i.e. phase modulator $\phi 1$ in the case of the most significant bits. A radio frequency (RF) carrier signal is also fed to the input of each of phase modulators 11.

The phase modulator 11 changes the phase of the carrier signal to one of a number of predetermined output output phase levels, equispaced around a full 360°, in dependence on the state of its two control digits. For example, if the control digits are binary bits, the two control bits can take on one of four states, allowing one of four 90° spaced phases to be defined. The example of binary digits and four-level phase modulators will be used henceforth unless otherwise stated. However, it will be understood that more levels using other than binary digits may be used.

Figure 6:
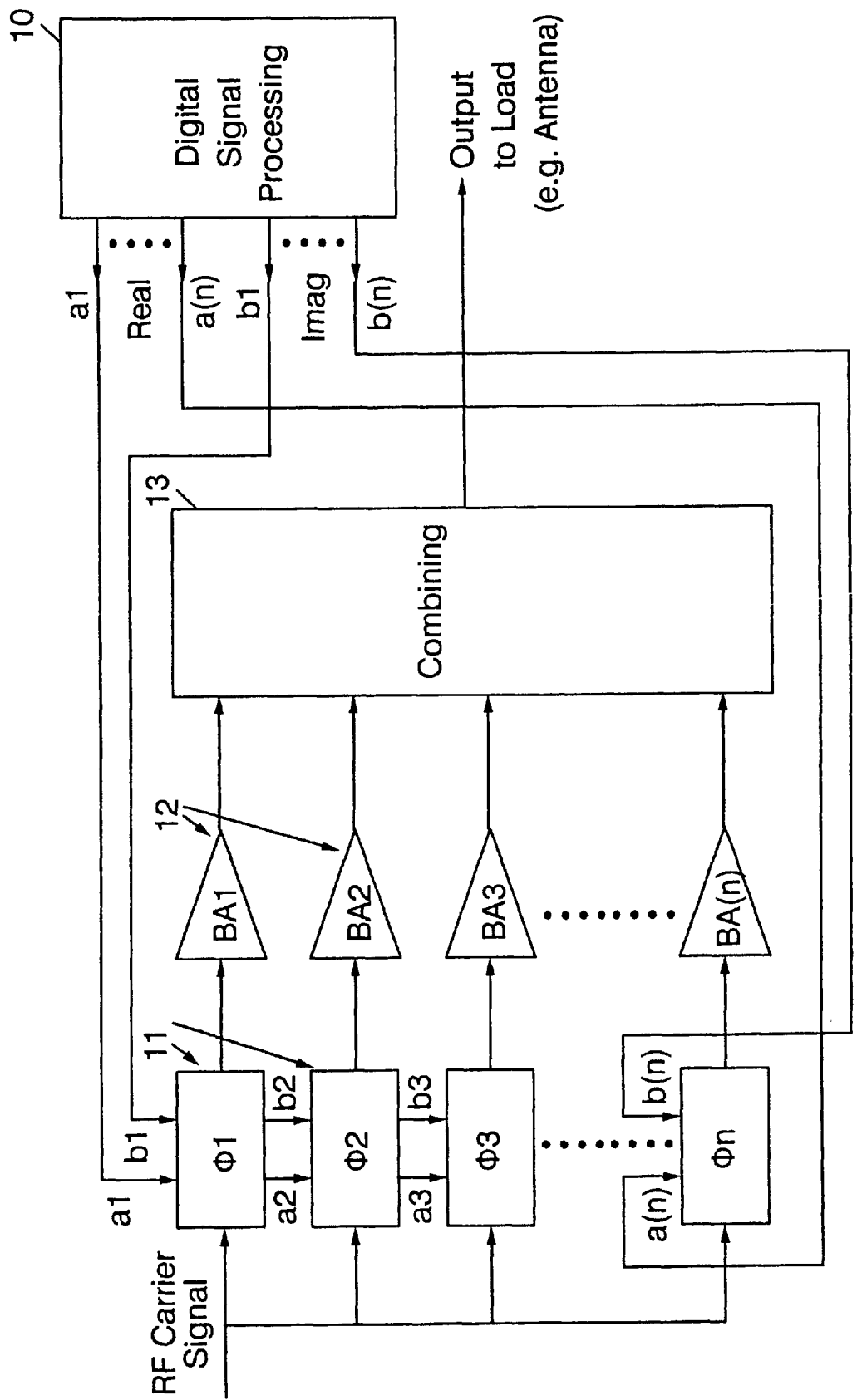
FIGS. 6 and 7 are block diagrams illustrating systems and methods for converting a stream of complex numbers into a modulated radio power signal using respective first and second embodiments of amplifiers according to the present invention.

Thus, the most significant bits ($a1, b1$) of the real and imaginary vector components will determine whether PA1 of power amplifiers (PA) 12 (FIG. 1) or BA1 of bilateral power amplifiers (BA) 12 (FIG. 6) is driven by phases of $+/-45°$ or $+/-135°$ relative to an arbitrary phase reference provided by the input radio frequency carrier signal. If PA1/BA1 has an output voltage amplitude of A1, it therefore delivers one of the four complex signal levels:

$A1(1+j)/\sqrt{2}$
$A1(1-j)/\sqrt{2}$
$A1(-1+j)/\sqrt{2}$ ps or
$A1(-1-j)/\sqrt{2}$ to combining circuit 13 in dependence on $a1$ and $b1$. The dependence on $a1$ and $b1$ can be described for all four possible levels by the formula:

$A1(a1+jb1)/\sqrt{2}$ where $a1=1$ for a binary 0 or $-1$ for a binary 1, and likewise for $b1$.

Likewise, if PA2/BA2 has output voltage amplitude A2, it will deliver one of the four complex signal voltage values:

$A2(1+j)/\sqrt{2}$
$A2(1-j)/\sqrt{2}$
$A2(-1+j)/\sqrt{2}$
or
$A2(-1-j)/\sqrt{2}$ to combining circuit 13, which can be expressed as $A2(a2+jb2)/\sqrt{2}$.

The combining circuit 13 combines the outputs of all power amplifiers 12, for example by voltage addition, to obtain a combined signal $(a1 \cdot A1 + a2 \cdot A2 + a3 \cdot A3 \ldots + a(n) \cdot A(n)) + j(b1 \cdot A1 + b2 \cdot A2 \ldots + b(n) \cdot A(n))$.

If the power amplifier outputs combine in ratios A1, A2, A3 ... which bear a declining power of two ratio to one another, such as when:

$A1=1; A2=1/2; A3=1/4; A4=1/8; \ldots A(n)=1/2^{n-1}$, then the bits $a1, a2, a3 \ldots a(n)$ add in proper binary significance to define a desired complex vector signal real part. Likewise $b1, b2 \ldots b(n)$ define a desired imaginary part.

Various embodiments of combining circuits 13 may be employed with the present invention. For example, in the above-cited U.S. Pat. No. 5,815,531, directional-coupler combining is disclosed for isolating each power amplifier from the effect of the others. The preferred directional coupler amplitude combining ratios are the square root of the power ratios of the power amplifiers, and the power ratios bear a declining power of two ratio to each other, such as 1 watt:0.5 watt:0.25 watt and so forth. This coupling arrangement may not deliver all the power amplifier-generated power to the load except when all power amplifiers are driven with the same phase.

Figure 2:
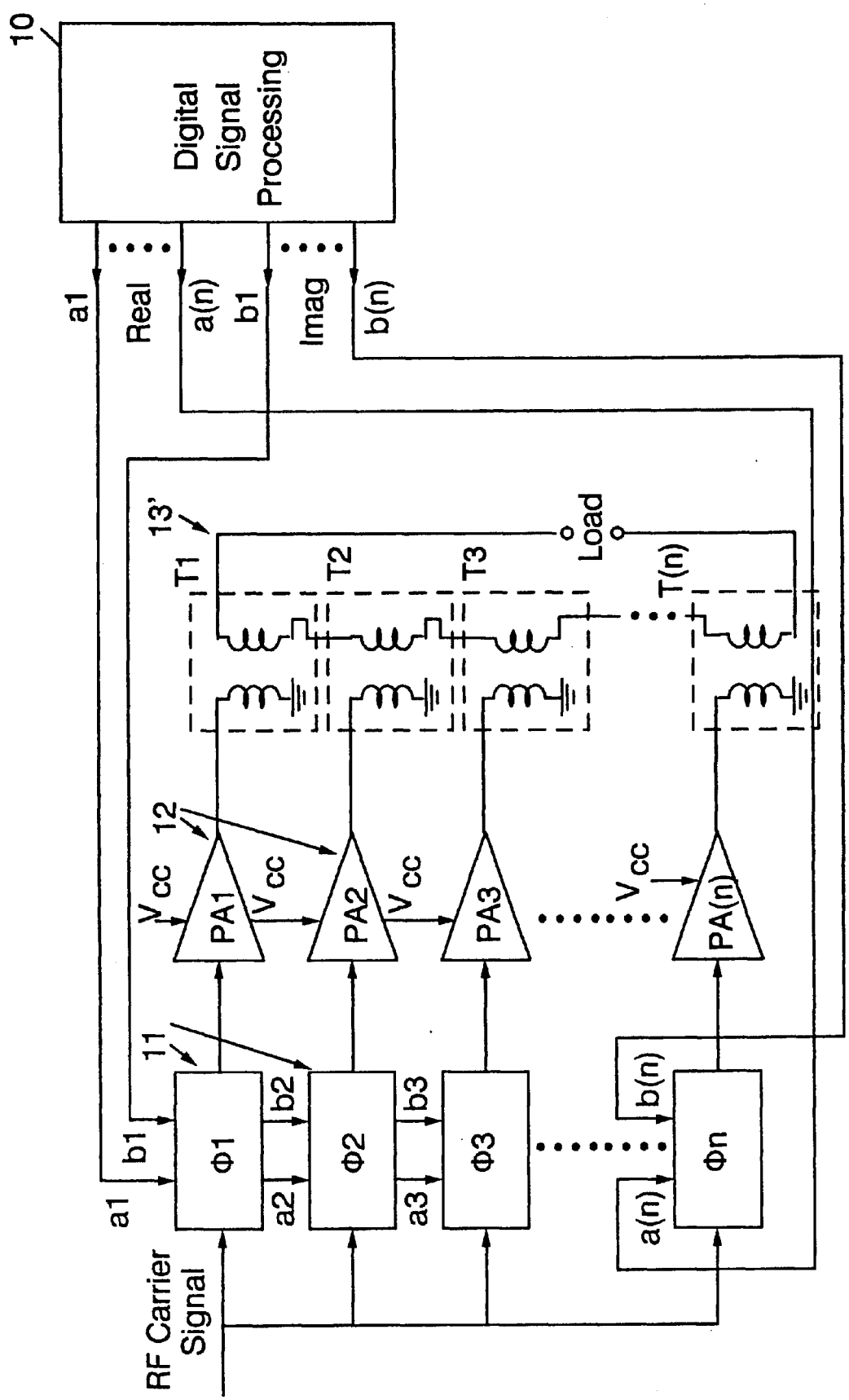
FIGS. 2 and 3 are block diagrams illustrating systems and methods for converting a stream of complex numbers into a modulated radio power signal using respective first and second embodiments of combining circuits according to the present invention.

Series combining of the power amplifier outputs is preferably provided, such that the power amplifiers are not isolated from one another, but rather the combined current due to the sum of their output voltages divided by the load impedance flows in each of the power amplifiers' output circuits. If one power amplifier alters its phase and thereby alters the combined voltage and current, the current in all the power amplifiers will then change to the new value. This is one of the two preferred combining techniques for the present invention, and is shown in FIG. 2. This technique is also illustrated in application Ser. No. 09/054,063, filed Apr. 2, 1998, entitled "Hybrid Chireix/Doherty Amplifiers and Methods" to the present co-inventor Dent assigned to the assignee of the present invention, the disclosure of which is hereby incorporated herein by reference, and application Ser. No. 09/054,060, filed Apr. 2, 1998 entitled "Power Waveform Synthesis Using Bilaterial Devices" to the present co-inventor Dent, assigned to the assignee of the present invention, the disclosure of which is hereby incorporated herein by reference.

In FIG. 2, the combining circuit 13' comprises transformers T1, T2, T3 ... T(n). The primary of each transformer is connected to the output of its respective power amplifier 12. The secondaries of all transformers are connected in series and to the load. If all power amplifiers are supplied by the same DC source of voltage Vcc and generate the same saturated voltage swing (also referred to as an "amplifier power level") at their outputs, then to provide combination according to a binary weighting, the primary turns to secondary turns ratio (also referred to as a "combining ratio") of T(i+1) is greater than that of T(i) by a factor of two. For example, T1 can have a 1:1 primary: secondary turns ratio; then T2 has a 2:1 ratio, T3 a 4:1 ratio, etc.

Alternatively, if all power amplifiers are not supplied with the same DC power supply voltage source, but with voltage sources in the ratio 1:1/2:1/4:1/8 . . . then the binary weighting is incorporated into these graded supply voltages and the transformer turns ratios can be equal. A hybrid solution having a portion of the binary weighting in the Vcc ratios and the rest in the transformer ratios can also be provided.

Figure 3:
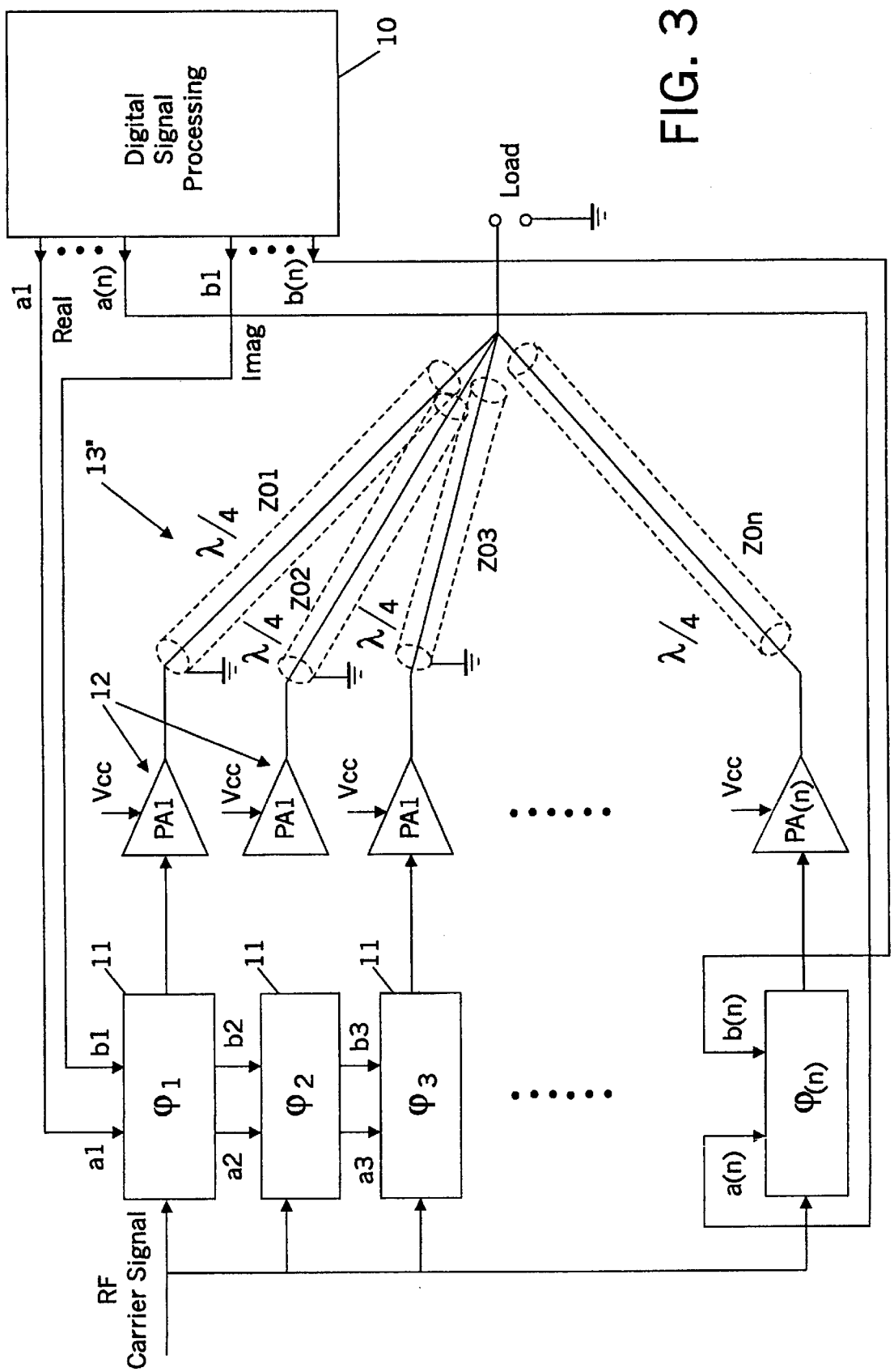

FIG. 3 shows a second preferred combining circuit 13". This embodiment ensures that each power amplifier output device passes the same current waveform by assuring the same voltage one quarter wavelength away. Due to the dual-reciprocal properties of a quarter wave transmission line, λ/4, if the voltage at one end is defined to be V0, then the current at the other end is determined to be V0/Z0, where Z0 is the characteristic impedance of the line.

Thus, if all power amplifiers 12 are fed by the same voltage supply Vcc and generate the same output voltage swing V0, then the currents at the junctions of the quarter wave lines λ/4 will be V0/Z01 from PA1; V0/Z02 from PA2 . . . and V0/Z0n from PA(n). To ensure that these currents sum in a binary ratio, the line impedances Z01, Z02 . . . Z0n shall therefore bear an increasing power of two ratio to each other, i.e. $Z01:Z02:Z03 \ldots :Z0n=1:2:4 \ldots :2^n$.

Alternatively, the transmission lines λ/4 may be of the same impedance and the binary weighting may be obtained by using different Vccs in a decreasing power of two ratio. It is also possible to combine the use of output transformers as in FIG. 2 with quarter-wave lines as in FIG. 3, with or without scaled Vccs, as long as the Vcc for each stage divided by the transformer primary to secondary ratio and divided by the respective line impedance has a 2:1 ratio between successive stages. For a ternary digit representation, where a(i) and b(i) can take on values of +1, 0 or −1, then the coupling circuit combines the power amplifier outputs in power of three ratios.

Figure 4:
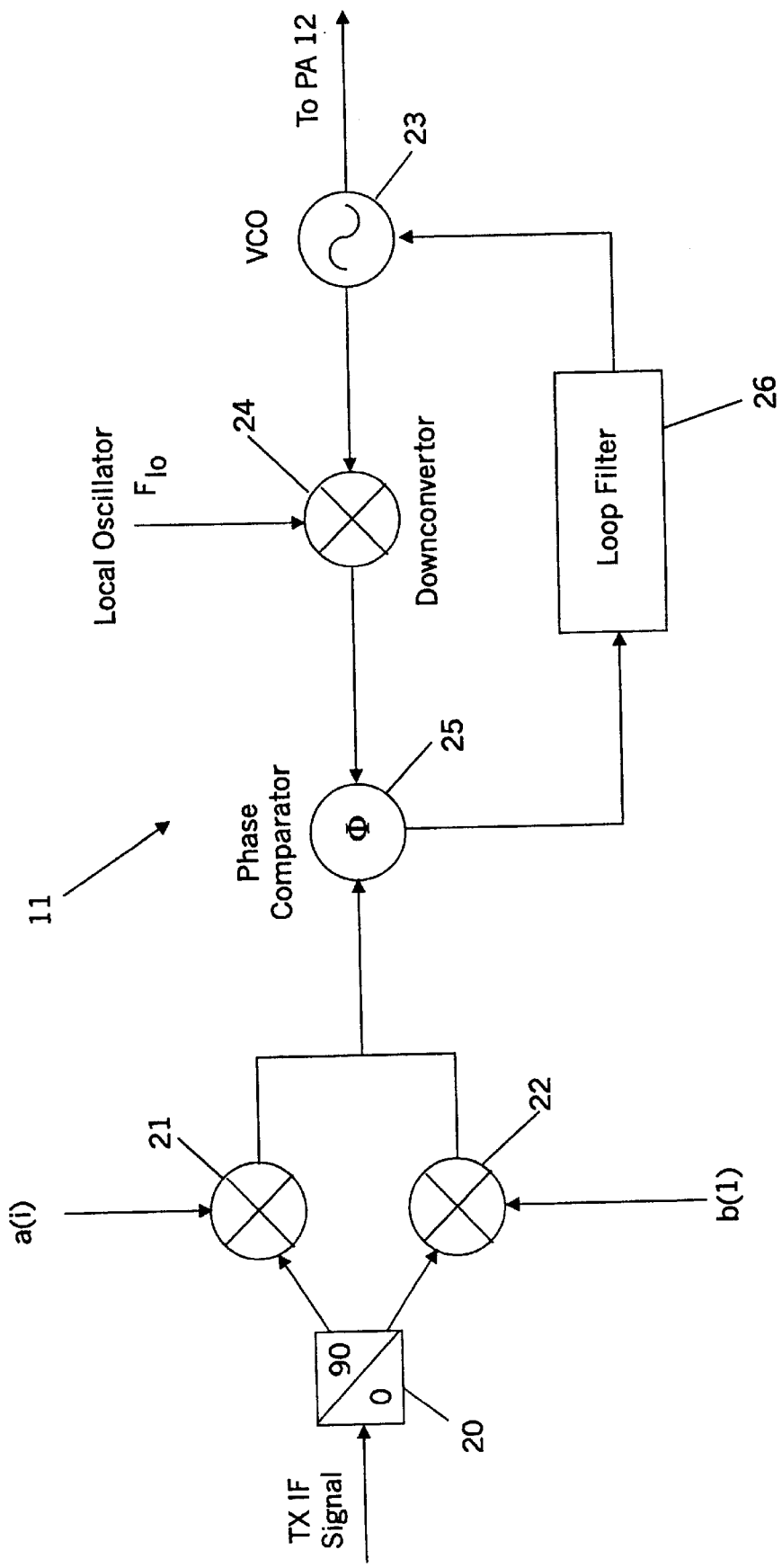
FIG. 4 is a block diagram of an embodiment of a phase modulator of FIGS. 1–3.

When ternary is used however, the power amplifiers may no longer generate constant output power, which may lead to a potential loss of efficiency. FIG. 4 illustrates an embodiment of a phase modulator 11 of FIGS. 1–3. As shown, a power amplifier drive signal is formed that is controllable in phase through four 90° spaced phase values.

A constant frequency signal, referred to as the Transmit Intermediate Frequency (TXIF) signal, is supplied to an IQ modulator, including a phase splitter 20 and a pair of modulators 21 and 22. A phase splitter 20 generates two TXIF signals 90° apart in phase. A common phase splitter can be used for all pairs of IQ modulators 21, 22. Alternatively, each can have its own phase splitter. The balanced modulator 21 either inverts or does not invert the phase of the first split TXIF signal from the splitter 20 in dependence on the polarity of bit a(i). The balanced modulator 22 either inverts or does not invert the second phase split signal from the splitter 20 according to the polarity of control bit b(i). The balanced modulators 21, 22 preferably are Gilbert cells integrated into an integrated circuit chip, and the current outputs of Gilbert cells may be added by parallelling their outputs. The combined signal comprises a cosine part of sign a(i) and a sine part of sign b(i), which together define a complex signal vector having one of the four desired 90° spaced angles, which is one input to a phase comparator 25.

A controlled oscillator 23 such as a Voltage Controlled Oscillator (VCO) generates a signal at the desired radio transmitter channel frequency and drives an associated one of power amplifiers 12. VCO 23 also provides an output signal to a downconvertor 24, where it is mixed with a common local oscillator frequency $F_{lO}$ chosen to produce a downvertor output frequency equal to TXIF. The TXIF output signal from the mixer 24 is then phase-compared in phase comparator 25 with the phase-modulated TXIF signal from the modulator to generate a phase error signal. The phase error signal from phase comparator 25 is then filtered and integrated in a loop filter 26 to provide a control signal for the VCO 23, forcing its frequency to be $F_{lO}$+OR−TXIF and forcing the VCO phase to adopt one of the four 90° positions selected by a(i) and b(i).

Circuits such as FIG. 4 have been successfully integrated into integrated circuit chips, and within the present state of the art several such circuits can be fabricated in one chip. Thus, the invention can provide a single chip for implementing all phase modulators, the chip having a real control word input a1, a2 . . . a(n) and an imaginary word control input b1, b2, . . . b(n).

As previously described, the real word and the imaginary word are preferably changed to new values at alternate instants of a clock rather than at the same instant, so that the phase change at each clock period may only be +90° or −90° and may never be 180°. This can facilitate the design of the phase comparator 25 and the loop filter 26 to effect a smooth transition of the VCO phase value from one value to the next. This may be desirable to ensure that the resultant output signal transitions smoothly between successive complex vector points to thereby preferably contain the transmitted spectral energy within an allocated channel and preferably avoid spectral spreading to adjacent channels.

Figure 5:
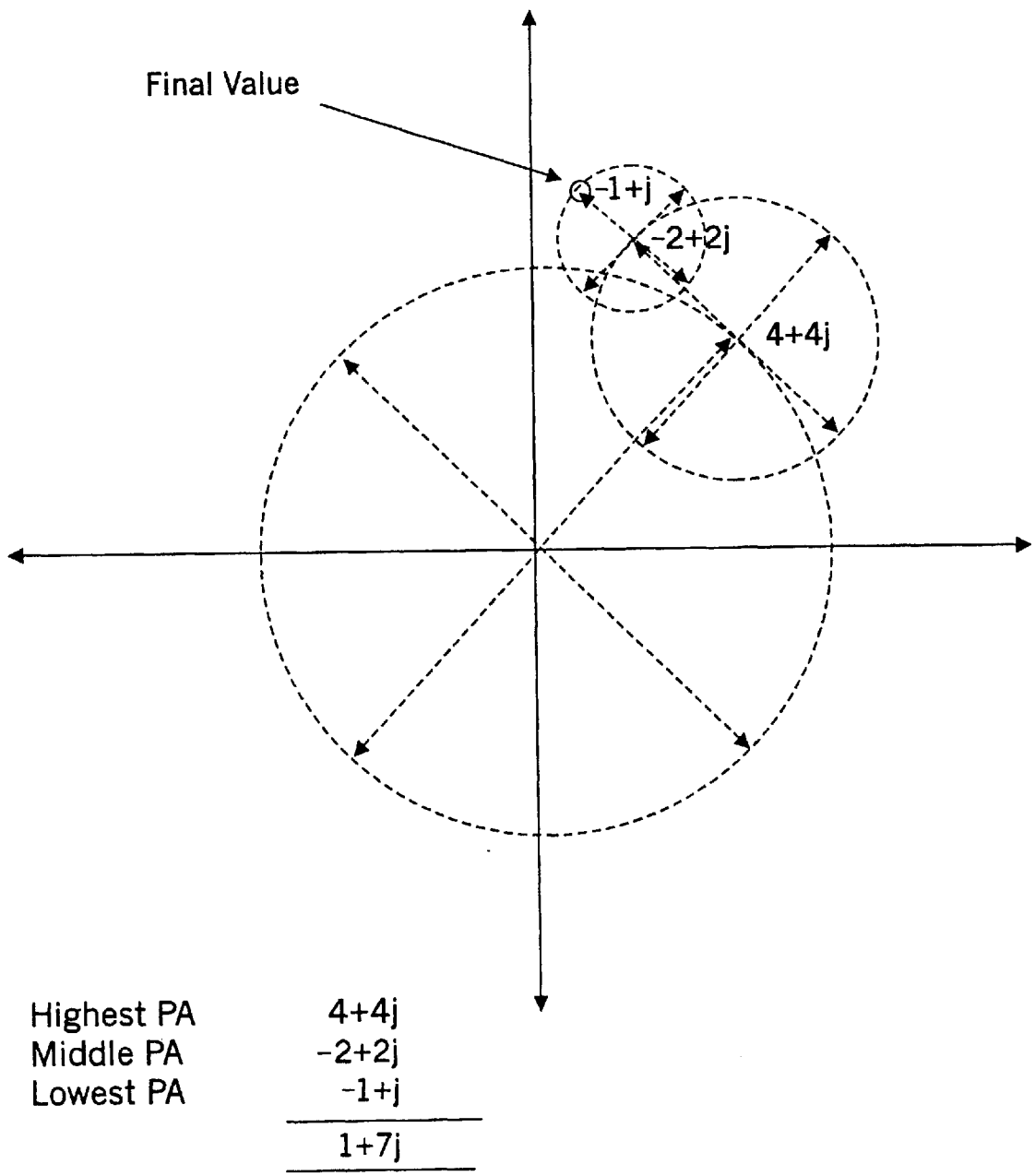
FIG. 5 graphically illustrates forming an instantaneous signal vector by adding three signal vectors according to the present invention.

FIG. 5 illustrates the formation of an instantaneous signal vector 1+7j by adding the outputs of three power amplifiers having power outputs in the ratio 1:1/4:1/16 and amplitude outputs in the ratio 1:1/2:1/4. The power amplifier of highest power has an output amplitude of $4\sqrt{2}$, and can generate any one of the four vectors (4+4j), (4−4j), (−4+4j), (−4−4j), which may be recognized as Quadrature Phase Shift Keying (QPSK) vectors. If the real and imaginary values change at different times, i.e. on odd and even clock cycles respectively, the vectors are Offset QPSK (OQPSK) vectors. The power amplifier of middle power likewise generates output vectors of (2+2j), (2−2j), (−2+2j) or (−2−2j), while the power amplifier of lowest power generates one of (1+j), (1−j), (−1+j) or (−1−j). By selecting the phase 4+4j to be generated by the power amplifier of highest power, (−2+j) by the power amplifier of middle power and (−1+j) by the power amplifier of lowest power, the vector (4−2−1)+j(4+2+1)=(1+7j) is generated as illustrated.

In FIG. 5, any point that can be defined by three real bits and three imaginary bits can be reached. To reach points in between, additional, even lower power power amplifiers can be added to increase the number of bits used to represent the vector parts. Alternatively, the Chireix/Doherty hybrid technique of the above described application Ser. No. 09/054, 063, can be used to generate a least significant remainder part that can lie anywhere within the +/−0.5+/−0.5j circle, i.e. by combining two extra low power power amplifiers whose phases are continuously controlled and not limited to four phase values.

Figure 7:
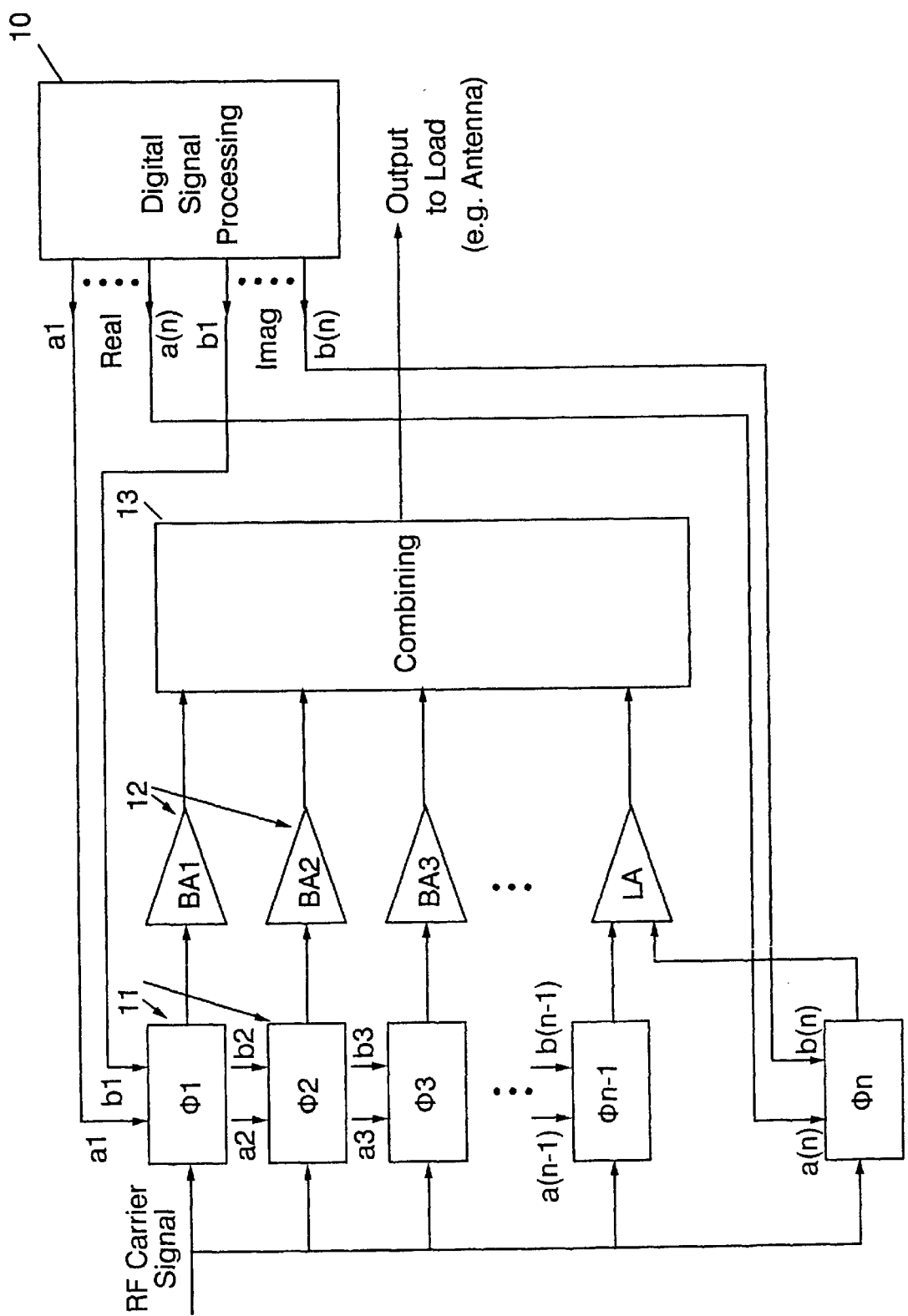

Other phase modulator implementations may be provided. For example, as shown in FIG. 7, one modification which may be made is to replace a number of the power amplifiers of lower significant power by a pair of low power power amplifiers connected by a linear amplifier (LA) according to the hybrid Chireix/Doherty amplifier of the above incorporated application Ser. No. 09/054,063, which can implement all of the contributions of the lower significant bits by suitable control of their phases using those least significant bits. In this way, high accuracy of waveform synthesis can be achieved using a limited number of stages. All such variations are considered to lie within the scope and spirit of this invention as described by the following claims.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A method of generating a modulated radio power signal at a radio carrier frequency, the method comprising the steps of:

sampling an information signal at a predetermined sampling rate to produce a series of samples of the information signal; generating a stream of complex numbers representing the series of samples of the information signal;

representing a real part of each of the complex numbers as a plurality of first digits of decreasing numerical significance;

representing an imaginary part of each of the complex numbers as a plurality of second digits of decreasing numerical significance;

grouping a respective one of the first digits and a respective one of the second digits of like numerical significance to form a plurality of phase control symbols;

using a respective phase control symbol to control the phase of an output signal at the radio carrier frequency from a respective one of a plurality of power amplifiers, each of the power amplifiers providing an output power level at an amplifier output that is related to the numerical significance of the first and second digits that form the associated phase control symbol; and combining the amplifier outputs of the plurality of power amplifiers to form the modulated radio power signal.

2. A method according to claim 1 wherein the combining step comprises the step of applying a respective one of the amplifier outputs to a primary winding of a respective one of a plurality of transformers, the secondary windings of which are serially coupled to produce the modulated radio power signal.

3. A method according to claim 1 wherein the combining step comprises the steps of:

applying a respective amplifier output to a respective quarter wave transmission line; and coupling the quarter wave transmission lines to one another to produce the modulated radio power signal.

4. A method according to claim 1 further comprising the steps of:

coupling at least two of the phase control symbols of the least numerical significance to at least one linear amplifier to produce a linear output; and wherein the combining step comprises the step of combining the linear output and the amplifier outputs of the plurality of power amplifiers to form the modulated radio power signal.

5. A method according to claim 1 wherein the digits are binary digits such that each of the phase control symbols is one of four values.

6. A method according to claim 1 wherein the plurality of power amplifiers are a plurality of saturated power amplifiers that produce a constant radio frequency voltage output.

7. A method according to claim 1 wherein the plurality of power amplifiers are a plurality of bilateral power amplifiers that allow current to flow from and to an amplifier power supply.

8. A system for generating a modulated radio power signal at a radio carrier frequency, the system comprising:

a sampler that samples an information signal at a predetermined sampling rate to produce a series of samples of the information signal;

a device that generates a stream of complex numbers representing the series of samples of the information signal;

a processor that represents a real part of each of the complex numbers as a plurality of first digits of decreasing numerical significance, and that represents an imaginary part of each of the complex numbers as a plurality of second digits of decreasing numerical significance to form a plurality of phase control symbols from a respective one of the first digits and a respective one of the second digits of like numerical significance;

a plurality of power amplifiers, a respective one of which amplifies a respective one of the phase control symbols modulated on the radio carrier frequency, each of the power amplifiers providing an output power level at an amplifier output that is related to the numerical significance of the first and second digits that form the associated phase control symbol; and a combining circuit that combines the amplifier outputs of the plurality of power amplifiers to form the modulated radio power signal.

9. A system according to claim 8 wherein the combining circuit comprises a plurality of transformers each having a primary winding and a secondary winding, a respective primary winding being coupled to a respective power amplifier, the plurality of secondary windings being serially coupled to produce the modulated radio power signal.

10. A system according to claim 8 wherein the combining circuit comprises a plurality of quarter wavelength transmission lines, a respective one of which is coupled between a respective power amplifier and an output node to produce the modulated radio power signal at the output node.

11. A system according to claim 8 wherein the digits are binary digits such that each of the phase control symbols has one of four values.

12. A system according to claim 8 wherein the power amplifiers are saturated power amplifiers that produce a constant radio frequency voltage output at the amplifier output.

13. A system according to claim 8 wherein the power amplifiers are bilateral power amplifiers that allow current flow from and to an amplifier power supply.

14. A system according to claim 8 further comprising at least one linear amplifier that is associated with at least two of the phase control symbols of least numerical significance, to generate a linear output voltage at an output thereof that is proportional to the combined values of the at least two of the first and second digits of least numerical significance, wherein the combining circuit combines the output of the at least one linear amplifier and the amplifier outputs of the power amplifiers.

15. A system for generating a modulated radio power signal at a radio carrier frequency, the system comprising:

means for sampling an information signal at a predetermined sampling rate to produce a series of samples of the information signal;

means for generating a stream of complex numbers representing the series of samples of the information signal;

means for representing a real part of each of the complex numbers as a plurality of first digits of decreasing numerical significance and for representing an imaginary part of each of the complex numbers as a plurality of second digits of decreasing numerical significance to form a plurality of phase control symbols from a respective one of the first digits and a respective one of the second digits of like numerical significance;

means for power amplifying a respective one of the phase control symbols modulated on the radio carrier frequency to provide a plurality of output power levels that are related to the numerical significance of the first and second digits that form the associated phase control symbol; and means for combining the output power levels to form the modulated radio power signal.

16. A system according to claim 15 wherein the combining means comprises:
means for serially combining the plurality of output power levels to produce the modulated radio power signal.

17. A system according to claim 15 wherein the combining means comprises:
means for converting the plurality of output power levels to a plurality Of output currents; and
means for combining the plurality of output currents to produce the modulated radio power signal.

18. A system according to claim 15 wherein the digits are binary digits such that each of the phase control symbols has one of four values.

19. A system according to claim 15 further comprising means for generating a linear output voltage that is proportional to the combined values of at least two of the first and second digits of least numerical significance, wherein the combining means comprises means for combining the linear output voltage and the output power levels to form the modulated radio power signal.

20. A system for generating a modulated radio power signal at a radio carrier frequency, the system comprising:
a sampler that samples an information signal at a predetermined sampling rate to produce a series of samples of the information signal;
a device that generates a stream of complex numbers representing the series of samples of the information signal;
a processor that represents a real part of each of the complex numbers as a plurality of first digits of decreasing numerical significance, and that represents an imaginary part of each of the complex numbers as a plurality of second digits of decreasing numerical significance;
a plurality of phase modulators, a respective one of which is responsive to a respective one of the plurality of first digits and a respective one of the plurality of second digits of like numerical significance, and to the radio carrier frequency, to produce a phase modulated output at the radio carrier frequency;
a plurality of power amplifiers, a respective one of which amplifies a respective one of the phase modulated outputs of the phase modulators to an amplifier power level at an amplifier output thereof; and
a combining circuit that combines the amplifier outputs of the power amplifiers according to a combining ratio to produce the modulated radio power signal, at least one of the amplifier power level and the combining ratio being selected such that the modulated radio power signal is related to the numerical significance of the plurality of first and second digits.

21. A system according to claim 20 wherein each of the power amplifiers produces same amplifier power level and wherein the combining ratio is selected such that the amplifier outputs of the power amplifiers are combined according to a ratio that is related to the numerical significance of the digits that are associated with the respective power amplifier.

22. A system according to claim 20 wherein the combining ratio is unity and wherein the amplifier power level of a respective power amplifier is related to the numerical significance of the digits that are associated therewith.

23. A system according to claim 20 wherein both the amplifier power level and the combining ratio are selected such that the modulated radio power signal is related to the numerical significance of the plurality of first and second digits.

24. A system according to claim 20 wherein the combining circuit comprises a plurality of transformers each having a primary winding and a secondary winding, a respective primary winding being coupled to a respective power amplifier, the plurality of secondary windings being serially coupled to produce the modulated radio power signal.

25. A system according to claim 20 wherein the combining circuit comprises a plurality of quarter wavelength transmission lines, a respective one of which is coupled between a respective power amplifier and an output node to produce the modulated radio power signal at the output node.

26. A system according to claim 20 wherein the digits are binary digits such that each of the phase modulated outputs has one of four values.

27. A system according to claim 20 wherein the power amplifiers are saturated power amplifiers that produce a constant radio frequency voltage output at the amplifier power level.

28. A system according to claim 20 wherein the power amplifiers are bilateral power amplifiers that allow current flow from and to an amplifier power supply.

29. A system according to claim 20 further comprising at least one linear amplifier that is associated with at least two of the first and second digits of least numerical significance, to generate a linear output voltage at an output thereof that is proportional to the combined values of the at least two of the first and second digits of least numerical significance, wherein the combining circuit combines the output of the at least one linear amplifier and the amplifier outputs of the power amplifiers.

30. A system for generating a modulated radio power signal at a radio carrier frequency, the system comprising:
means for sampling an information signal at a predetermined sampling rate to produce a series of samples of the information signal;
means for generating a stream of complex numbers representing the series of samples of the information signal;
means for representing a real part of each of the complex numbers as a plurality of first digits of decreasing numerical significance and for representing an imaginary part of each of the complex numbers as a plurality of second digits of decreasing numerical significance;
means for producing a plurality of phase modulated outputs at the radio carrier frequency in response to the plurality of first digits, the plurality of second digits and the radio carrier frequency;
means for amplifying a respective one of the phase modulated outputs to a respective power level; and means for combining the amplified phase modulated outputs according to a combining ratio to produce the modulated radio power signal, at least one of the respective amplifier power level and the combining ratio being selected such that the modulated radio power signal is related to the numerical significance of the plurality of first and second digits.

31. A system according to claim 30 wherein the means for amplifying comprises means for amplifying a respective one of the phase modulated outputs to same power level and wherein the combining ratio is selected such that the phase modulated outputs are combined according to a ratio that is related to the numerical significance of the digits that are associated with the respective phase modulated output.

32. A system according to claim 30 wherein the combining ratio is unity and wherein the respective power levels are related to the numerical significance of the digits that are associated therewith.

33. A system according to claim 30 wherein both the respective power level and the combining ratio are selected such that the modulated radio power signal is related to the numerical significance of the plurality of first and second digits.

34. A system according to claim 30 wherein the combining means comprises:

means for serially combining the plurality of power levels to produce the modulated radio power signal.

35. A system according to claim 30 wherein the combining means comprises:

means for converting the plurality of power levels to a plurality of output currents; and means for combining the plurality of output currents to produce the modulated radio power signal.

36. A system according to claim 30 wherein the digits are binary digits such that each of the phase modulated outputs has one of four values.

37. A system according to claim 30 further comprising means for generating a linear output voltage that is proportional to the combined values of at least two of the first and second digits of least numerical significance, wherein the combining means comprises means for combining the linear output voltage and the output power levels to form the modulated radio power signal.

38. A method for generating a modulated radio power signal at a radio carrier frequency, the method comprising the steps of:

sampling an information signal at a predetermined sampling rate to produce a series of samples of the information signal;

generating a stream of complex numbers representing the series of samples of the information signal;

representing a real part of each of the complex numbers as a plurality of first digits of decreasing numerical significance;

representing an imaginary part of each of the complex numbers as a plurality of second digits of decreasing numerical significance;

modulating a respective one of the plurality of first digits and a respective one of the plurality of second digits of like numerical significance onto the radio carrier frequency, to produce a plurality of phase modulated outputs at the radio carrier frequency;

amplifying a respective one of the phase modulated outputs to a power level; and combining the amplified phase modulated outputs according to a combining ratio to produce the modulated radio power signal, at least one of the power level and the combining ratio being selected such that the modulated radio power signal is related to the numerical significance of the plurality of first and second digits.

39. A method according to claim 38 wherein the amplifying step comprises the step of amplifying a respective one of the phase modulated outputs to same power level; wherein the combining ratio is selected such that the amplified phase modulated outputs are combined according to a combining ratio that is related to the numerical significance of the digits that are associated with the respective phase modulated output.

40. A method according to claim 38 wherein the combining ratio is unity and wherein the respective power levels are related to the numerical significance of the digits that are associated therewith.

41. A method according to claim 38 wherein both the respective power level and the combining ratio are selected such that the modulated radio power signal is related to the numerical significance of the plurality of first and second digits.

42. A method according to claim 38 wherein the combining step comprises the step of:

serially combining the plurality of power levels to produce the modulated radio power signal.

43. A method according to claim 38 wherein the combining step comprises the steps of:

converting the plurality of power levels to a plurality of output currents; and combining the plurality of output currents to produce the modulated radio power signal.

44. A method according to claim 38 wherein the digits are binary digits such that each of the phase modulated outputs has one of four values.

45. A method according to claim 38 further comprising the step of generating a linear output voltage that is proportional to the combined values of at least two of the first and second digits of least numerical significance, wherein the combining step comprises the step of combining the linear output voltage and the output power levels to form the modulated radio power signal.

46. A method according to claim 38 wherein the real part is represented at successive odd instants of a clock and the imaginary part is represented at successive even instants of the clock.

\* \* \* \* \*

UNITED STATES PATENT AND TRADEMARK OFFICE
CERTIFICATE OF CORRECTION

PATENT NO. : 6,201,452 B1
DATED : March 13, 2001
INVENTOR(S) : Paul W. Dent et al.

It is certified that error appears in the above-identified patent and that said Letters Patent is hereby corrected as shown below:

(56) References Cited
OTHER PUBLICATIONS
U.S. Pat. application 09/209,104 filed Dec. 10, 1998.
U.S. Pat. application 09/216,466 filed Dec. 18, 1998.

Column 9,
Line 15, please begin a new paragraph with "generating".

Column 11,
Line 23, please change "Of" to -- of --.

Signed and Sealed this

Twenty-eighth Day of August, 2001

Attest:

NICHOLAS P. GODICI
*Attesting Officer*   *Acting Director of the United States Patent and Trademark Office*